United States Patent
Altekrüger et al.

(10) Patent No.: US 7,828,897 B2
(45) Date of Patent: Nov. 9, 2010

(54) CRYSTAL PULLING APPARATUS AND METHOD FOR THE PRODUCTION OF HEAVY CRYSTALS

(75) Inventors: Burkhard Altekrüger, Alzenau (DE); Stefan Henkel, Stockstadt (DE); Axel Vonhoff, Friesenheim-Oberweiler (DE); Erich Tomzig, Burgkirchen (DE); Dieter Knerer, Burghausen (DE)

(73) Assignees: Crystal Growing Systems GmbH, Asslar (DE); Siltronic AG, Munich (DE)

(*) Notice: Subject to any disclaimer, the term of this patent is extended or adjusted under 35 U.S.C. 154(b) by 107 days.

(21) Appl. No.: 11/881,023

(22) Filed: Jul. 25, 2007

(65) Prior Publication Data
US 2008/0022922 A1    Jan. 31, 2008

(30) Foreign Application Priority Data
Jul. 26, 2006    (DE) .................. 10 2006 034 433

(51) Int. Cl.
*C30B 15/02*    (2006.01)

(52) U.S. Cl. .................. 117/208; 117/200; 117/217; 117/218; 117/911

(58) Field of Classification Search .......... 117/200, 117/208, 217, 218, 911
See application file for complete search history.

(56) References Cited

U.S. PATENT DOCUMENTS

| | | | | | |
|---|---|---|---|---|---|
| 5,935,329 | A | * | 8/1999 | Schulmann | 117/218 |
| 5,938,843 | A | * | 8/1999 | Hiraishi et al. | 117/218 |
| 6,139,633 | A | * | 10/2000 | Nishiura | 117/208 |
| 6,299,684 | B1 | * | 10/2001 | Schulmann | 117/218 |

FOREIGN PATENT DOCUMENTS

| | | |
|---|---|---|
| JP | 05-2 70 975 A | 10/1993 |
| JP | 11-1 99 373 A | 7/1999 |

* cited by examiner

*Primary Examiner*—Robert M Kunemund
(74) *Attorney, Agent, or Firm*—Fulbright & Jaworski L.L.P

(57) ABSTRACT

A pulling apparatus and a method with which especially heavy crystals (5) can be pulled using the Czochralski method utilizing the pulling apparatus. For this purpose the neck (4) of the crystal (5) has an enlargement (10) beneath which extends the support device. This device includes latches (7), which are moved from a resting position into an operating position in which the latches (7) extend beneath the enlargement (10). Each latch (7) is supported on the base body such that it is swivellable about a pivot axis (8) and can assume two stable positions, namely the resting position and the operating position. Each of these positions is defined by a stop on the base body. When the latch rests on the one stop, its center of gravity, viewed from the neck (4), is located on the other side of the pivot axis (8). When the latch rests on the other stop, the center of gravity is located on this side of the pivot axis (8). The actuation of the latches (7) takes place with actuation means disposed stationarily in the apparatus.

9 Claims, 2 Drawing Sheets

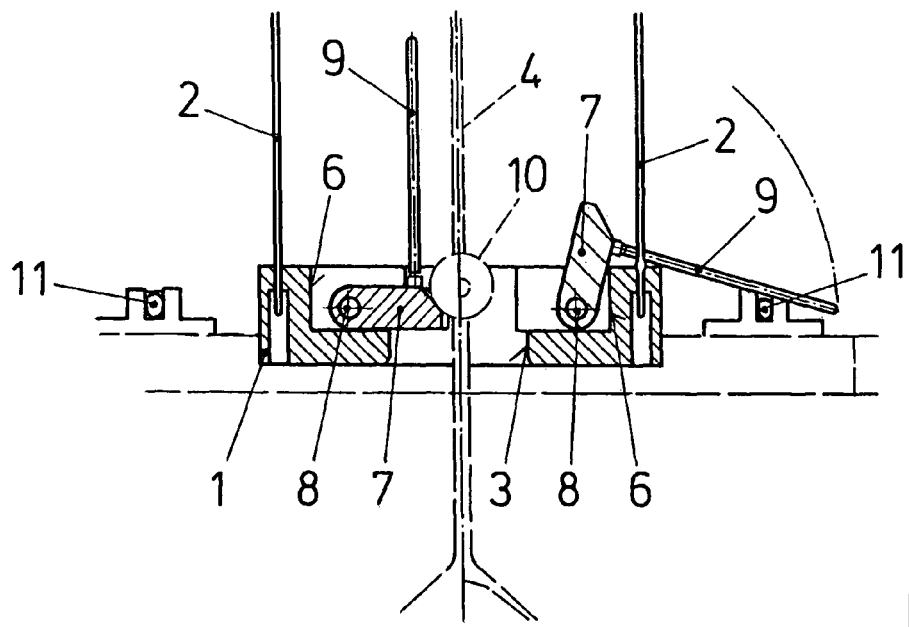
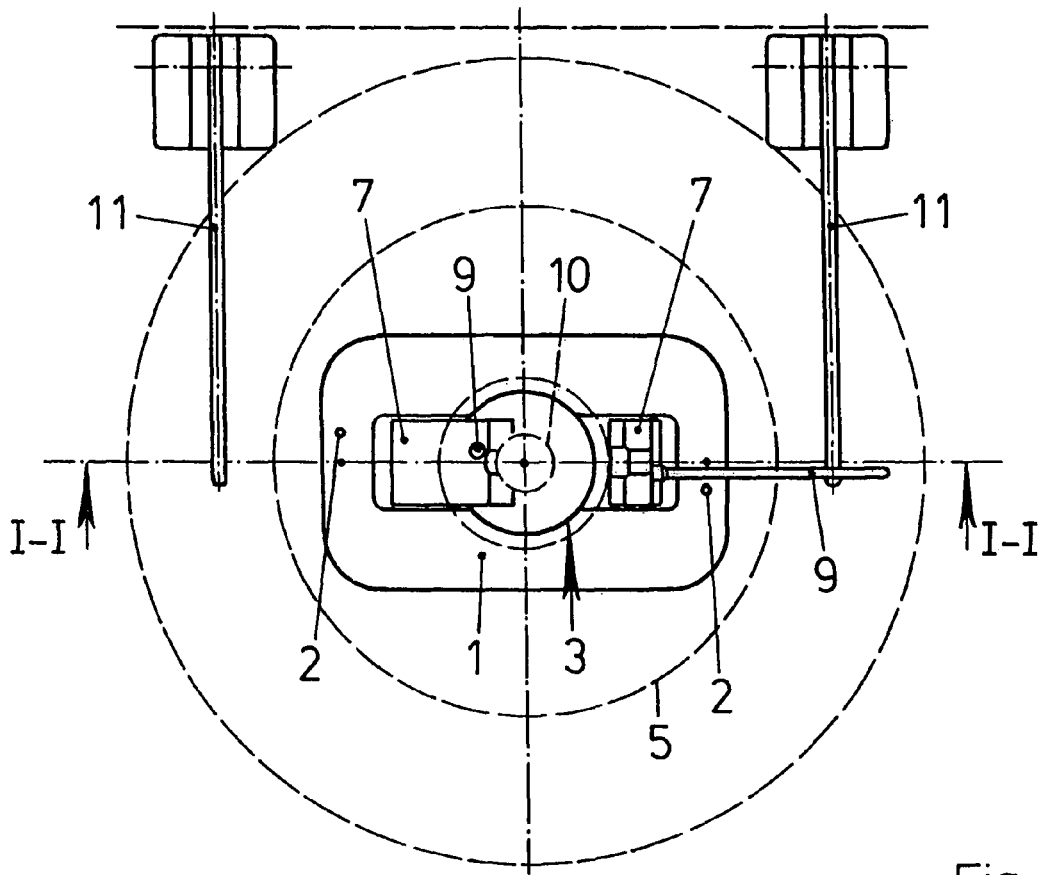

CRYSTAL PULLING APPARATUS AND METHOD FOR THE PRODUCTION OF HEAVY CRYSTALS

RELATED APPLICATIONS

This application claims priority from German Patent Application No. 10 2006 034 433. 2 filed Jul. 26, 2006, which is incorporated herein by reference in its entirety.

BACKGROUND AND SUMMARY OF THE INVENTION

The invention relates to a crystal pulling apparatus, in particular a crystal pulling apparatus using the Czochralski method, with a crystal lifting and rotating device with which the crystal suspended by its neck is pulled out of the melt, the neck including an upper thinner region and a lower thicker region and an enlargement between them, with a support device for the crystal supplementing the crystal lifting and rotating device. The support device comprises a base body, which can be lowered independently of the crystal lifting and rotating device and can be raised in coordination with the crystal lifting and rotating device, on which at least two latches are supported such that they can be moved from a resting position, in which the latches are capable of passing the enlargement, into an operating position, in which the latches extend beneath the enlargement. Subject matter of the invention is also a method for the production of heavy crystals in such a crystal pulling apparatus.

When pulling a crystal using the Czochralski method, first a neck is grown which is strongly reduced in cross section in order to largely minimize or eliminate the structural defects, in particular dislocations, stemming from the surface-fusing or propagated from the crystal seed, through a type of "growing out" from the neck of the growth crystal. The growth is subsequently set such that after a conical section follows a cylindrical section with a much larger section of nearly constant diameter and at the end again a conical section. As the starting product for the production of, for example, wafers, lastly only the cylindrical section of the crystal is of interest. To optimize the economic production of the wafers, greater diameters are increasingly required. This results in greater weight of the grown crystals. The problem is encountered here that the neck, which for reasons of growth technology must be kept thin, can no longer absorb the weight of the crystal.

Several support devices have therefore already been proposed. DE 101 11 953 A1 discloses a system, in which the neck is provided with an enlargement, which is attained through the specific control of the pulling process. The neck below the enlargement is here thicker than the section above the enlargement. A support device extends beneath this enlargement such that a portion of the load can be transferred via the support device onto a further lifting device. The support device is comprised of an annular base body, in which two latches or levers are swivellably supported. By means of hydraulic actuation means located in the base body the latches can be moved from a resting position, in which the latches are able to pass the enlargement, into an operating position, in which the latches extend beneath the enlargement. The actuation means is relatively complex and expensive. For each latch must be provided a cylinder to be actuated pneumatically as well as an elastic counterbearing. This type of actuation means is highly complex and, moreover, is prone to trouble since the region of the apparatus in which the support device is located has a high temperature.

U.S. Pat. No. 5,938,843 describes a very simple principle. The latches are two forks, which are swivellably supported on the base body. They are disposed against a stop which defines their operating position.

When lowering the base body along the neck of the crystal the forks are initially pressed to the side by the enlargement, such that the base body can pass the enlargement. As soon as the base body is beneath the enlargement, the forks fold back. When the base body is raised, the forks come into contact on the underside of the enlargement and herein come to be braced on the stop. As the base body is raised further, the load of the crystal can now be braced here. While this arrangement is very simple, it has nevertheless the disadvantage that when the base body is lowered, the forks slide along the enlargement and can damage it. Furthermore, particles are generated through abrasion which form impurities in the melt and in the crystal and can also lead to the formation of dislocations. Contact with the crystal can cause vibrations and oscillations of the crystal body which can also lead to structural defects of the crystal.

The invention addresses the problem of providing a crystal pulling apparatus with a support device for the crystal, which overcomes the above listed problems and which simultaneously is structured as simple as possible and is therefore less prone to trouble.

To solve the problem the invention provides that each latch is supported on the base body swivellably about a pivot axis and that the base body includes for each latch one stop determining the resting position and one stop determining the operating position, these stops being disposed such that in the resting position, seen from the direction of the neck, the center of gravity of the latch is located on the other side of the pivot axis and in the operating position is located on this side of the pivot axis.

Accordingly each latch is supported on the base body such that it is swivellable about a pivot axis and can assume two stable positions, namely the resting position and the operating position. In this way the actuation means can be considerably simplified since only simple mechanically acting means suffice to move the latches from the resting position into an unstable position, in which the center of gravity of the latch is over the pivot axis, from which it automatically tips over into the operating position. According to the invention the latches are herein actuated without any adverse effect onto the crystal: the movement of the latches from the resting position into the operating position is initiated without the crystal needing to be contacted for this purpose. A disturbance of the crystal growth through the actuation process is consequently excluded.

The base body is preferably a ring encompassing the neck of the crystal, on whose circumference the latches are uniformly distributed. In the simplest case it is sufficient to provide two opposing latches.

The invention provides furthermore that the latches can be mechanically moved from the resting position into the operating position by means of a stationary actuation means disposed in the crystal pulling apparatus.

In such an arrangement the base body itself can be kept free of actuation means such that it can be of simple structure. Due to the externally located actuation means, the latches can be kept in their resting position while they pass the enlargement during the lowering of the base body, such that no contact occurs between the enlargement and the latches. Only after the base body has passed the enlargement are the latches brought mechanically from the resting into the operating position through the external actuation means.

In order for the latches to be able to cooperate with the externally located actuation means, a portion of the latch is implemented as a rod, which, in the resting position, projects radially outwardly beyond the edge of the crystal. The actuation means must be located in a region of the apparatus outside of the projected diameter of the crystal such that during the continuing pulling process the crystal can move between the actuation means. The actuation means are elements preferably implemented as bars which extend tangentially with respect to the crystal and which are located within the path of motion of the rods.

The bars can preferably be held foldably on the housing of the crystal pulling apparatus and therefore only need to be brought into a horizontal position for the purpose of actuating the latches. However, the actuation elements can also assume any suitable position other than a horizontal one. Their form is also not limited to that of a bar; plates are, for example, equally suitable. The actuation elements can also be supported displaceably such that, before the crystal pulling, they can be brought into the intended position on the housing which subsequently determines the length, and therewith the weight, of the crystal, at which the latches are actuated. This position is advantageously selected under the aspect that the support device can absorb a portion of the crystal weight before an excess load is placed onto the neck region of the crystal and the crystal threatens to fracture in this region. This means that the actuation elements during the pulling of crystals with relatively large diameters are positioned further down on the housing of the crystal pulling apparatus, thus closer in the direction toward the melt, than is the case when pulling crystals with smaller diameters.

The support device is coupled with at least one further lifting and rotating device, such that the crystal weight is distributed onto two lifting and rotating devices. The distribution of the weight is set with the aid of the lifting rate of the support device and of the elasticity of the cables holding them. The rotations of the lifting and rotating devices must be so synchronized that they rotate at the same speed.

The invention relates further to the support device itself as defined by the characterizing features of claim 10.

In order to transfer the crystal load onto the support device, such is lowered by means of the further lifting and rotating device until the enlargement is located above the actuation means. The latches are initially in their resting position. After passing the actuation means, they fold open into their operating position; the support device with the further lifting and rotating device is subsequently raised again such that the folded-in latches come to rest in contact on the lower side of the enlargement and therewith assume a portion of the load of the crystal. The degree of load assumption, and therewith the lifting rate of the support device, is regulated on the basis of a value supplied by a load sensor and an allowed load value. The rotational movement of the support device is synchronized according to the master-slave method with the rotational movement of the crystal lifting and rotating device, in which the crystal lifting and rotating device assumes the master function and the further lifting and rotating device the slave function.

In the following the invention will be explained in further detail in conjunction with an embodiment example. In the drawing depict:

DETAILED DESCRIPTION

Figure 1A:
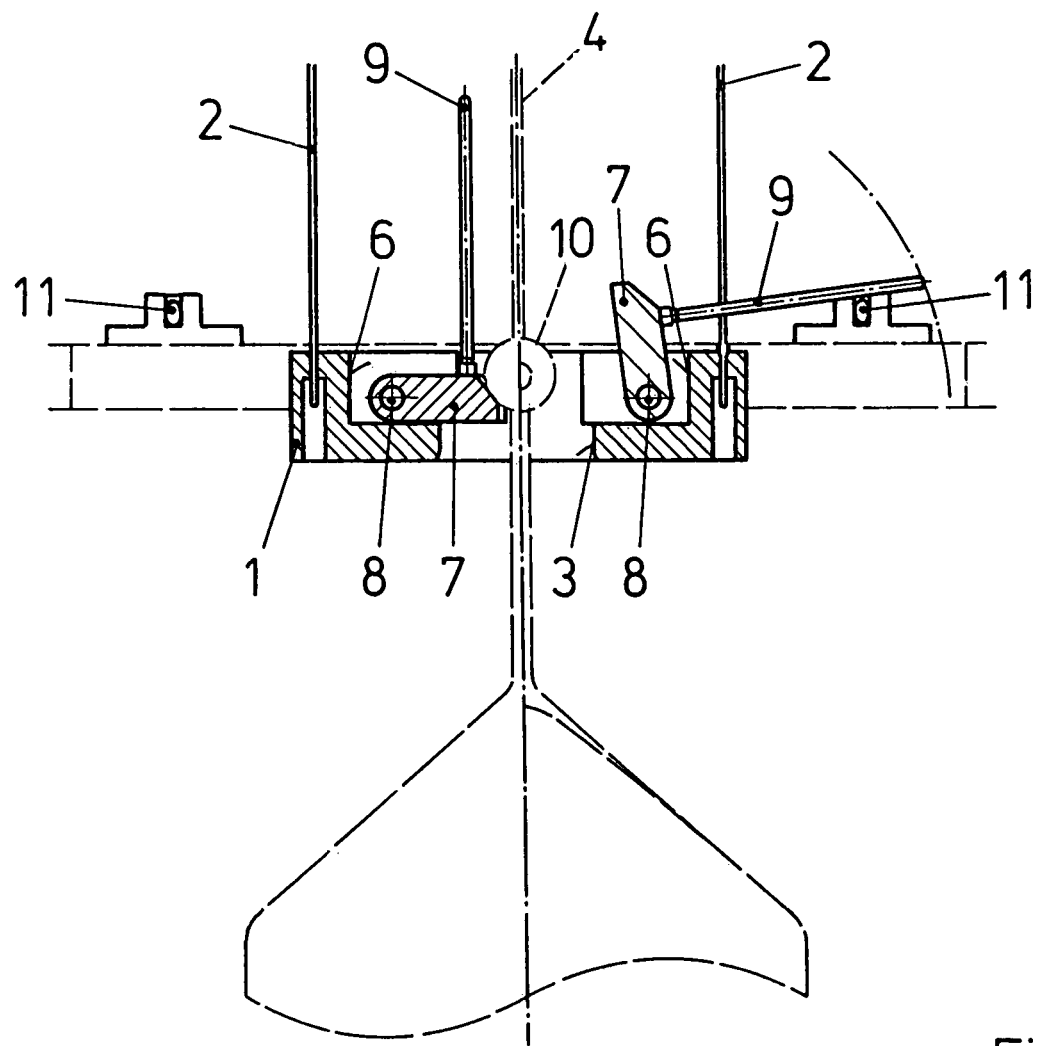
FIG. 1 a lateral view of a support device comprising a latch
FIG. 1a a further lateral view of the support device with another position of the latch,
FIG. 2 a top view onto a support device according to FIG. 1.

The further elements of a crystal pulling apparatus are not shown since these are structures well known to a person of skill in the art.

According to FIG. 1 the support device is comprised of a base body 1 suspended by means of at least two, preferably four, cables 2 on a further lifting and rotating device, not further shown here, the crystal while rotating being pulled from the melt with their aid and the aid of the crystal lifting and rotating device.

As is evident in FIG. 2, the outer contour of the base body 1 is extended toward two opposing sides and, consequently, has the shape of a stretched octagon. In the center of the base body is located a circular breakthrough 3, through which the neck 4 of the crystal 5 is guided.

Opposite one another on the top side of the base body 1 are located two recesses 6, in each of which one latch 7 is supported swivellably about a pivot axis 8. From the top side of each latch 7 projects one rod 9.

A latch 7 can assume two stable positions. One is the operating position, depicted on the left side in FIG. 1, in which the bottom side of latch 7 rests on the top side of the recess 6. The latch 7 projects here into the breakthrough 3 and can therefore extend beneath the enlargement 10 on neck 4 of crystal 5.

In the resting position the latch 7 is folded open outwardly and either the top side of latch 7 is stayed on the margin of the recess 6 or the rod 9 is stayed on the top side of the base body 1. This resting position is depicted on the right side of FIGS. 1 and 2, in which resting position the center of gravity of latch 7 is located on the other side of pivot axis 8.

The free end of latch 7 is outside of breakthrough 3, such that the enlargement 10 can be guided through the breakthrough 3.

In the resting position the center of gravity of latch 7 is slightly on the other side of the pivot axis 8, such that a slight tilting of latch 7 moves it into an unstable position between resting position, and operating position from which it folds by force of gravity into the operating position shown on the left. This unstable intermediate position is shown on the right side of FIG. 1a. The center of gravity of latch 7 is located precisely above the pivot axis 8. The folding movement is actuated thereby that rod 9 is brought into contact with a bar 11 disposed stationarily in the housing of the crystal pulling apparatus and thereby, when the base body 1 is lowered further, tilts rod 9, and therewith latch 7, into the unstable position (FIG. 1a), from which the latch 7 drops automatically into the operating position.

The bars 11 are supported on the housing of the crystal pulling apparatus such that they are tiltable. In their active actuation positions they extend horizontally into the housing. However, they maintain herein a distance from that region through which moves the crystal.

Rods 9 on latches 7 must therefore be of an appropriate length in order to cross bars 11.

Crystal 5 is suspended by the neck 4 on a conventional lifting and rotating device, which may be a cable draw mechanism or a mechanism with a draw winch.

The rotations of the crystal as well as of the support device are synchronized such that both lifting and rotating device have the same rotational speed when the latches 7 extend under the enlargements 10. The regulation here takes place according to the master-slave method, wherein the regulation for the lifting and rotating device of the crystal functions as the master.

To arrive at an appropriate load distribution between the two lifting and rotating devices, at least on one lifting and rotating device, preferably on that for the support device, a load sensor or a torque sensor is provided.

After it is completed, the crystal is preferably cut below the enlargement in the neck region and below the support device, with the latches still being in the operating position.

LIST OF REFERENCE NUMBERS

1 Base body
2 Cable
3 Breakthrough
4 Neck
5 Crystal
6 Recess
7 Latch
8 Pivot axis
9 Rod
10 Enlargement
11 Bar It is claimed:

1. A crystal pulling apparatus using the Czochralski method comprising a crystal lifting and rotating device with which a crystal suspended by a neck is pulled from a melt, the neck including an upper thinner region and a lower thicker region and an enlargement between them;
    a support device for the crystal supplementing the crystal lifting and rotating device comprising a base body, which can be lowered independently of the crystal lifting and rotating device and, in coordination with the crystal lifting and rotating device, can be raised, on which at least two latches are supported such that they can be moved from a resting position, wherein the latches are capable of passing the enlargement, into an operating position wherein the latches extend beneath the enlargement, wherein each latch is supported on the base body such that it is swivellable about a pivot axis and that the base body comprises for each latch one stop determining the resting position and one stop determining the operating position, these stops being so disposed that in the resting position the center of gravity of the latch, viewed from the neck, is located on the other side of the pivot axis and in the operating position is located on this side of the pivot axis, wherein the base body is a ring encompassing the neck on which the latches are uniformly distributed over the circumference, wherein the latches can be mechanically moved from the resting position into the operating position by means of actuation elements supported on a housing of the apparatus.

2. A crystal pulling apparatus as claimed in 1, wherein a portion of the latch is implemented as a rod which in the resting position projects radially outwardly beyond the edge of the crystal, the rod cooperating with one of the actuation elements, and that the actuation elements are disposed in a region of the apparatus located outside of the projected diameter of the crystal.

3. A crystal pulling apparatus as claimed in claim 1, wherein the actuation elements are implemented as bars, which extend tangentially to the crystal and which are located within a path of movement of the particular associated rod.

4. A crystal pulling apparatus as claimed in claim 3, wherein the bars are held on the housing of the crystal pulling apparatus such that they are foldable and for the purpose of actuating the latches can be moved into a horizontal position.

5. A crystal pulling apparatus as claimed in claim 1, wherein the support device is coupled with at least one further lifting and rotating device.

6. A crystal pulling apparatus as claimed in claim 5, wherein the apparatus comprises means with which the lifting and the rotating movements of the two lifting and rotating devices can be regulated or synchronized.

7. A crystal pulling apparatus as claimed in claim 6, wherein the further lifting and rotating devices include a load sensor or a torque sensor.

8. A support device for use in an apparatus as claimed in claim 1, comprising an annular base body on whose top side at least two latches are disposed, the base body comprising for each latch one stop determining the resting position and one determining the operating position, these stops being so disposed that in the resting position the center of gravity, viewed from the ring axis, is located on the other side of the pivot axis and in the operating position is located on this side of the pivot axis and that a portion of the latch is implemented as a rod which in the resting position projects radially outwardly.

9. A crystal pulling apparatus using the Czochralski method comprising a crystal lifting and rotating device with which a crystal suspended by a neck is pulled from a melt, the neck including an upper thinner region and a lower thicker region and an enlargement between them;
    a support device for the crystal supplementing the crystal lifting and rotating device comprising a base body, which can be lowered independently of the crystal lifting and rotating device and, in coordination with the crystal lifting and rotating device, can be raised, on which at least two latches are supported such that they can be moved from a resting position, wherein the latches are capable of passing the enlargement, into an operating position wherein the latches extend beneath the enlargement, wherein each latch is supported on the base body such that it is swivellable about a pivot axis and that the base body comprises for each latch one stop determining the resting position and one stop determining the operating position, these stops being so disposed that in the resting position the center of gravity of the latch, viewed from the neck, is located on the other side of the pivot axis and in the operating position is located on this side of the pivot axis wherein the base body is an open ring encompassing the neck on which the latches are uniformly distributed over the circumference.

* * * * *